United States Patent
Zhai et al.

(10) Patent No.: US 8,330,534 B2
(45) Date of Patent: Dec. 11, 2012

(54) CIRCUIT FOR NEGATIVE BIAS TEMPERATURE INSTABILITY COMPENSATION

(75) Inventors: Bo Zhai, Austin, TX (US); Wesley Favors, Round Rock, TX (US); Singh Teja, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 55 days.

(21) Appl. No.: 12/948,626

(22) Filed: Nov. 17, 2010

(65) Prior Publication Data

US 2012/0119825 A1 May 17, 2012

(51) Int. Cl.
*G05F 1/10* (2006.01)
(52) U.S. Cl. ........................................................ 327/543
(58) Field of Classification Search .................... None
See application file for complete search history.

(56) References Cited

U.S. PATENT DOCUMENTS

| | | | |
|---|---|---|---|
| 5,422,806 A | 6/1995 | Chen et al. | 700/29 |
| 5,982,225 A * | 11/1999 | Forhan et al. | 327/538 |
| 6,415,388 B1 | 7/2002 | Browning et al. | 713/322 |
| 6,646,915 B2 | 11/2003 | Kawase | 365/185.08 |
| 7,504,847 B2 * | 3/2009 | Goodnow et al. | 324/762.01 |
| 2006/0193157 A1 | 8/2006 | Ma et al. | 363/123 |
| 2008/0155282 A1 | 6/2008 | Gammie et al. | 713/300 |
| 2009/0085652 A1 | 4/2009 | Wiatr et al. | 327/540 |

OTHER PUBLICATIONS

McGowen et al., "Power and Temperature Control on a 90-nm Itanium Family Processor," *IEEE Journal of Solid-State Circuits*, vol. 41, No. 1, pp. 229-237, Jan. 2006.

Nakai et al., "Dynamic Voltage and Frequency Management for a Low-Power Embedded Microprocessor," *IEEE Journal of Solid-State Circuits*, vol. 40, No. 1, pp. 28-35, Jan. 2005.

* cited by examiner

*Primary Examiner* — Lincoln Donovan
*Assistant Examiner* — Sibin Chen
(74) *Attorney, Agent, or Firm* — Williams, Morgan & Amerson, P.C.

(57) ABSTRACT

An integrated circuit device includes a first circuit for providing current to a first node, and a degradation compensator including a first compensation circuit coupled to the first node to provide compensation current to the first node. The degradation compensator is operable to estimate a degree of degradation in the first circuit and provide a compensation signal to the first compensation circuit to control the amount of compensation current based on the estimated degree of degradation.

33 Claims, 5 Drawing Sheets

CIRCUIT FOR NEGATIVE BIAS TEMPERATURE INSTABILITY COMPENSATION

CROSS-REFERENCE TO RELATED APPLICATIONS

Not applicable.

BACKGROUND

The disclosed subject matter relates generally to integrated circuit devices and, more particularly, to a circuit for negative bias temperature instability compensation.

Negative Bias Temperature Instability (NBTI) is an issue in deep submicron technologies. NBTI affects devices which are kept in an active state for extended periods of time. For example, a custom array, or any domino circuit, often requires a keeper to hold the voltage on pre-charged bitlines if none of the pull down transistors fire. To be properly sized, the keeper should be large enough to compensate the pull down leakage under worst process corners and noise considerations and should also be small enough to ensure fast evaluation when pull down transistors do fire. However, NBTI effectively weakens the keeper PFET over time. In 40 nm process technology, positive bias temperature instability (PBTI) is not pronounced, and also most of the time, pull down NFETs are in off mode. In contrast, keeper PFETs are almost always stressed. Another example of such a stressed device is a sleep enable circuit that selectively charges a voltage bus during an active state and isolates the bus during a sleep state. In designing integrated circuit device, designers attempt to account for NBTI by adjusting the specifications of the device. Exemplary techniques for mitigating the effects of NBTI involve changing the specifications of the dynamic devices or attempting to compensate for the degradation.

Changing the specifications may include reducing the number of pull-down devices on the array bitlines (i.e., or the dynamic node in a generic domino logic circuit) such that required keeper size can be more readily met. This approach sacrifices design density, and is thus infeasible in large arrays. Oversizing the keeper to account for future degradation results in a performance penalty by increasing the pull-down speed.

A compensation approach involves periodically adjusting the body bias of the n-well where the keeper is formed. Such an approach is typically based upon a generic degradation circuit and applies a global body bias to all PFETs in the n-well. Applying forward bias to many large n-wells creates more leakage by slightly forward biasing the diodes. Also, the general bias is not specific to the actual keeper strength, resulting in the risk of over-compensating and slowing down a critical path as a result. Because the amount of forward bias is bounded by the diode onset voltage, the degree of compensation is limited. Finally, creating extra well-ties in dense arrays can consume significant circuit area.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in an integrated circuit device including a first circuit for providing current to a first node, and a degradation compensator including a first compensation circuit coupled to the first node to provide compensation current to the first node. The degradation compensator is operable to estimate a degree of degradation in the first circuit and provide a compensation signal to the first compensation circuit to control the amount of compensation current based on the estimated degree of degradation.

Another aspect of the disclosed subject matter is seen in an integrated circuit device including a first circuit for providing current to a first node and a degradation compensator. The degradation compensator includes a first compensation transistor coupled to the first node, a stressed circuit corresponding to at least a portion of the first circuit, a reference circuit corresponding to the at least a portion of the first circuit, and logic operable to compare responses of the stressed and reference circuits and, based on the comparison, generate a compensation signal for enabling the first compensation transistor to provide a compensation current to the first node based on a magnitude of the compensation signal.

Yet another aspect of the disclosed subject matter is seen in a method that includes providing current to a first node using a first circuit. Compensation current is provided to the first node using a first compensation circuit. A degree of degradation in the first circuit is estimated. A compensation signal is provided to the first compensation circuit to control the amount of compensation current based on the estimated degree of degradation.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
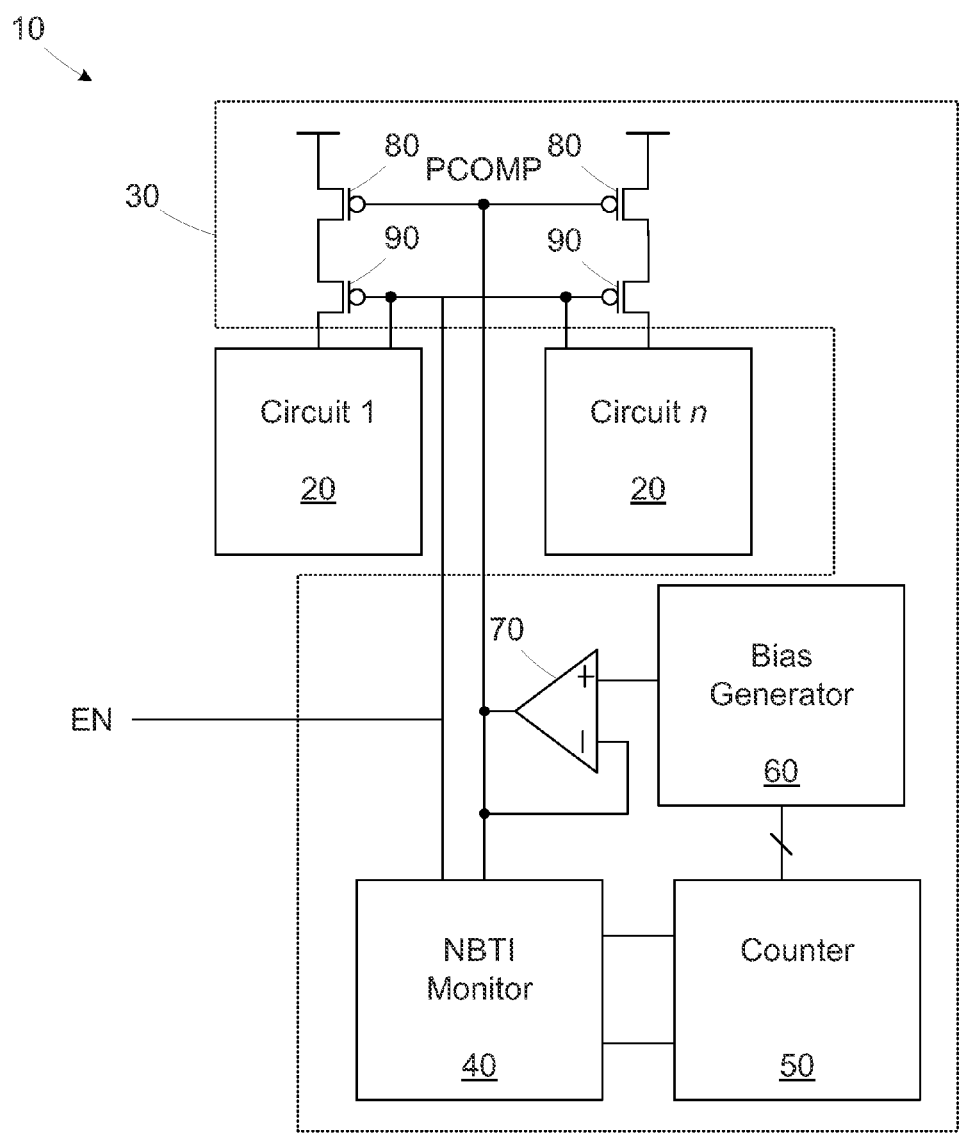
FIG. 1 is a simplified block diagram of a degradation compensator in accordance with one illustrative embodiment of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In an embodiment of the present subject matter, a compensation circuit is provided to provide additional current to a node being driven by a dynamic circuit, such as a keeper circuit or a sleep enable circuit. The compensation circuit includes two copies of at least a portion of the dynamic circuit. One copy is subjected to similar operating conditions as the dynamic circuit, so that degradation present in the dynamic circuit is similarly reflected in the first, or stressed, copy. The second copy, a reference copy, is maintained in a substantially unstressed state so that its performance more closely matches that of the dynamic circuit prior to experiencing degradation. The responses of the stressed and reference circuits may be compared to estimate the degree of degradation, and the amount of compensation current provided to the node can be controlled based on the degradation.

Referring now to the drawings wherein like reference numbers correspond to similar components throughout the several views and, specifically, referring to FIG. 1, the disclosed subject matter shall be described in the context of an integrated circuit device 10 including one or more dynamic circuits 20 and a degradation compensator 30 for compensating for negative bias temperature instability.

The degradation compensator 30 includes a NBTI monitor 40 for estimating the degradation of the dynamic circuit(s) 20. The NBTI monitor 40 increments or decrements a counter 50 based on the monitored degradation to controlling a bias generator 60 (e.g., a DC divider). The bias generator 60 drives an operational amplifier 70, which provides a compensation signal, PCOMP, for biasing a compensation transistor 80. An enable signal, EN, for enabling the dynamic circuit 20 is provided to a select transistor 90 for coupling the compensation transistor 80 to the dynamic circuit 20. For example, the enable signal may indicate when the devices subject to degradation in the dynamic circuit 20 (e.g., the keeper or sleep enable circuit) are active. Although the enable signal is illustrated as being externally supplied, it is contemplated that it may also be generated internal to the dynamic circuit 20, as illustrated below. In cases where multiple instances of the dynamic circuit 20 are present, the same compensation signal may be provided to each of the instances.

Figure 2:
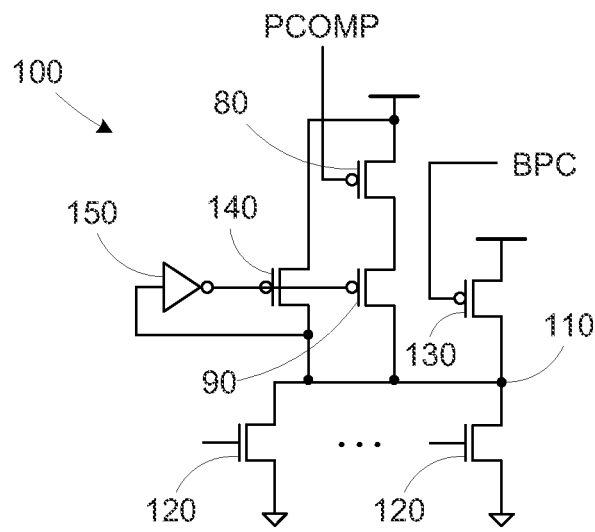
FIG. 2 is a diagram of a keeper circuit employing the degradation compensator of FIG. 1.

Turning now to FIG. 2 a circuit diagram illustrating how the compensation transistor 80 and select transistor 90 may be implemented with a memory circuit 100 as the dynamic circuit 20. The memory circuit 100 includes a bit line 110 to which a plurality of pull-down transistors 120 are coupled. A pre-charge transistor 130 is provided for pre-charging the bit line 110 responsive to a bit line pre-charge signal, BPC. After the bit line 110 is charged, the charge is maintained by a keeper transistor 140. A feedback path is provided by an inverter 150 coupled between the bit line 110 and the keeper transistor 140. As the voltage on the bit line 110 drops, the keeper transistor 140 is enabled by the inverter 150 to bring the voltage back up. The output of the inverter 150 is also provided to the select transistor 90 so that the compensation transistor 80 is coupled to the bit line 110 whenever the keeper transistor 140 is enabled. As will be described in greater detail below, the compensation transistor 80 provides additional current for charging the bit line 110 in a manner that compensates for the estimated degradation of the keeper transistor 140. As the degradation increases, the amount of supplemental current provided by the compensation transistor 80 increases.

Figure 3:
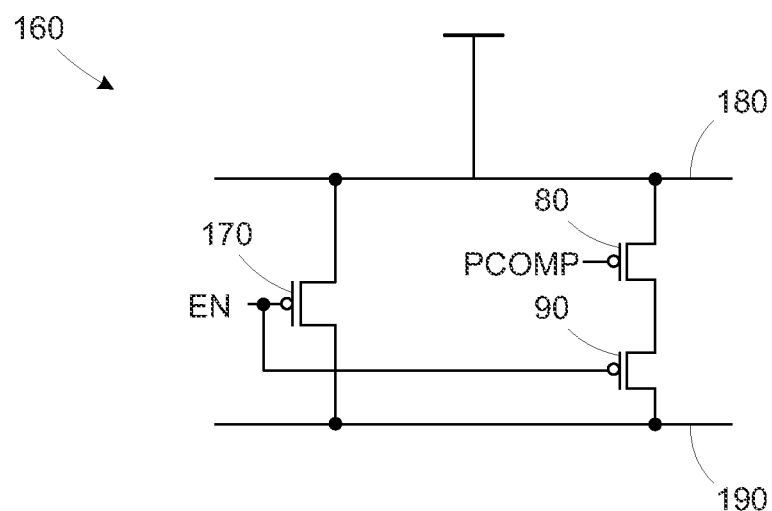
FIG. 3 is a diagram of a sleep enable circuit employing the degradation compensator of FIG. 1.

FIG. 3 is a circuit diagram illustrating how the compensation transistor 80 and select transistor 90 may be implemented with a sleep enable circuit 160 as the dynamic circuit 20. The sleep enable circuit 160 includes one or more sleep enable transistors 170 coupled between a primary voltage bus 180 and a secondary voltage bus 190. When devices powered by the secondary voltage bus 190 are active, the sleep enable transistor 170 is enabled. During a sleep mode, the sleep enable transistor 170 is disabled and the secondary voltage bus 190 is isolated from the primary voltage bus 180. The select transistor 90 is enabled by the same sleep enable signal, EN, as the sleep enable transistor 170. The compensation current provided by the compensation transistor 80 provides additional current for charging the secondary voltage bus 190 in a manner that compensates for the estimated degradation of the sleep enable transistor 170. As the degradation increases, the amount of supplemental current provided by the compensation transistor 80 increases.

Figure 4:
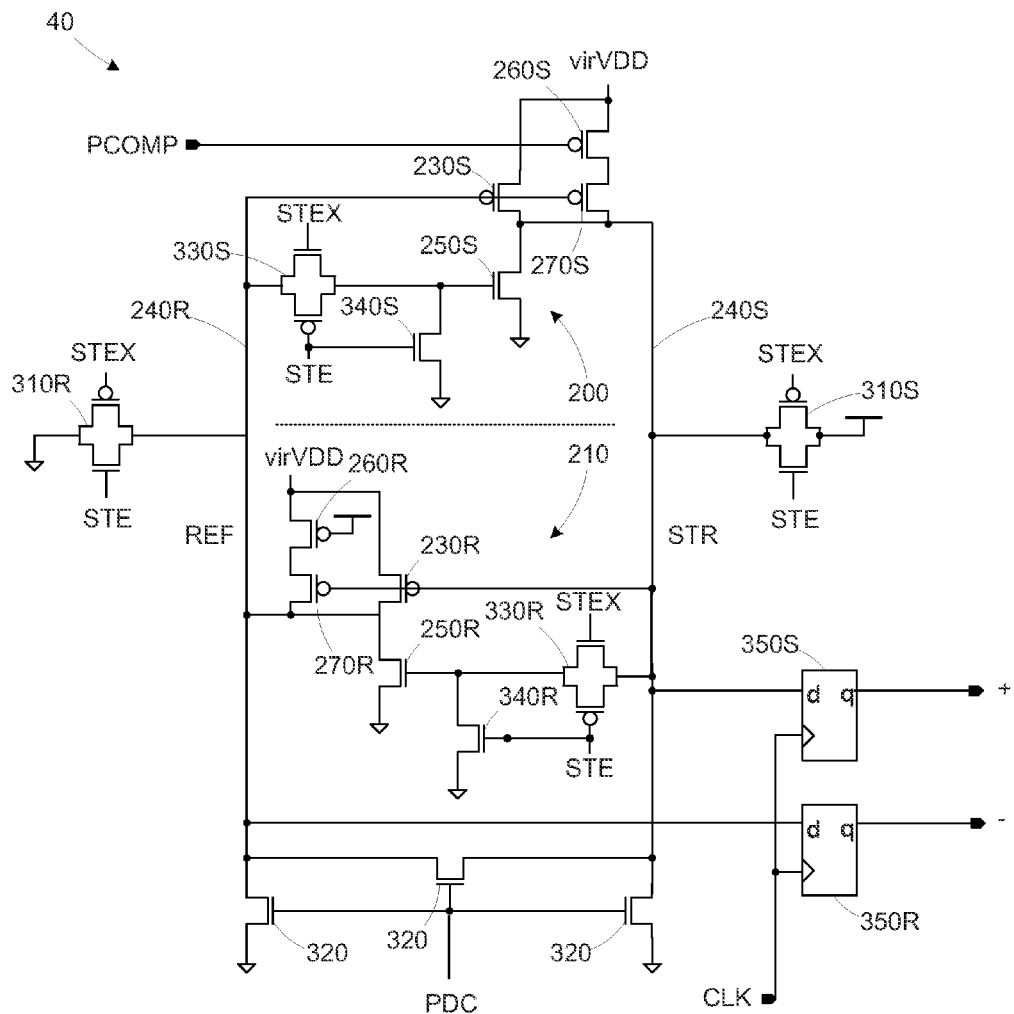
FIG. 4 is a circuit diagram of a negative bias temperature instability monitor in the degradation compensator of FIG. 1.
Figure 4:
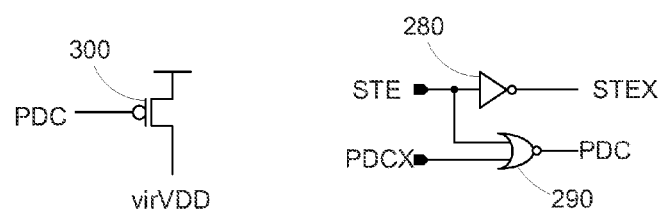

The operation of the degradation compensator 30 is now described in reference to FIG. 4, which illustrates a circuit diagram of the NBTI monitor 40 of FIG. 1. In general, the NBTI monitor 40 includes a stressed circuit 200 that attempts to mimic the degradation of the dynamic circuit 20 and a reference circuit 210 that essentially remains unstressed to provide a benchmark for estimating the degree of degradation in the stressed circuit 200. By comparing the responses of the stressed circuit 200 to the reference circuit 210, the level of compensation current provided by the compensation transistor 80 provided in the dynamic circuit 20 can be controlled so that performance of the dynamic circuit 20 can be maintained.

The stressed and reference circuits 200, 210 have circuitry mimicking the circuitry in the dynamic circuit 20 subject to NBTI degradation. For purposes of the following example, the monitoring and control of the compensation bias for the memory circuit 100 of FIG. 2 is illustrated. The stressed and reference circuits 200, 210 may be modified depending on the particular nature of the dynamic circuit 20. Elements of the stressed circuit 200 in FIG. 4 are suffixed with the letter "S", while elements of the reference circuit 210 are suffixed with the letter "R". When no suffix is used in this description, the elements of both circuits 200, 210 are described.

Each circuit 200, 210 includes a keeper transistor 230 the seeks to maintain voltage on a node 240 (e.g., a simulated bit line). A pull-down transistor 250 is coupled to the node 240. A compensation transistor 260 and a select transistor 270 are provided to mimic those provided in the dynamic circuit 20.

The NBTI monitor 40 switches between an operation mode, which simulates the operation of the dynamic circuit 20 and a measurement mode, in which the performance of the stressed and reference circuits 200, 210 is compared to estimate the level of degradation present. The NBTI monitor 40 employs a stress enable signal, STE, and its compliment, STEX, generated by an inverter 280. The stress enable signal is held high during the operation mode and held low during the measurement mode. The NBTI monitor 40 also employs a pre-discharge signal PDCX and its compliment, PDC, which is generated by a NOR-gate that also receives the STE signal. Thus, PDC is asserted high only when both STE and PDCX are low. The PDC signal is pulled low during the measurement mode to prepare the circuit and then asserted high to initiate the comparison between the stressed and reference circuits 200, 210. The NBTI monitor 40 generates a voltage signal, virVDD, using a transistor 300, such that virVDD is present when PDC is low.

Transmission gate switches 310 are provided to ground the reference node 240R and hold the stressed node 240S high during the operation mode. Transistors 320 enabled responsive to a high PDC signal are provided for cross-coupling and discharging the nodes 240 to prepare for the measurement cycle. Transmission gate switches 330 are provided to isolate the pull-down transistors 250 during the measurement mode. In the illustrated embodiment, LVT devices are employed for the transmission gate switches 310, 330 to minimize the effective resistance. Also, although the PBTI effects on the pull-down transistors 250 are minimal compared to the NBTI effects on the keeper transistors 230, transistors 340 that are enabled responsive to the STE signal being low during measurement mode are provided to shield the nodes 240 from an PBTI effects arising from the pull down transistors 250.

The wires and transistors of the NBTI monitor 40 are laid out to provide capacitance matching at the nodes 240. To minimize local variation effects arising from random dopant fluctuation (RDF), multiple fingers are created to average RDF effect in the nodes 240. As a result, the keeper transistors 230 may be multiple times the size of the keeper transistor 140 of FIG. 2.

Figure 5:
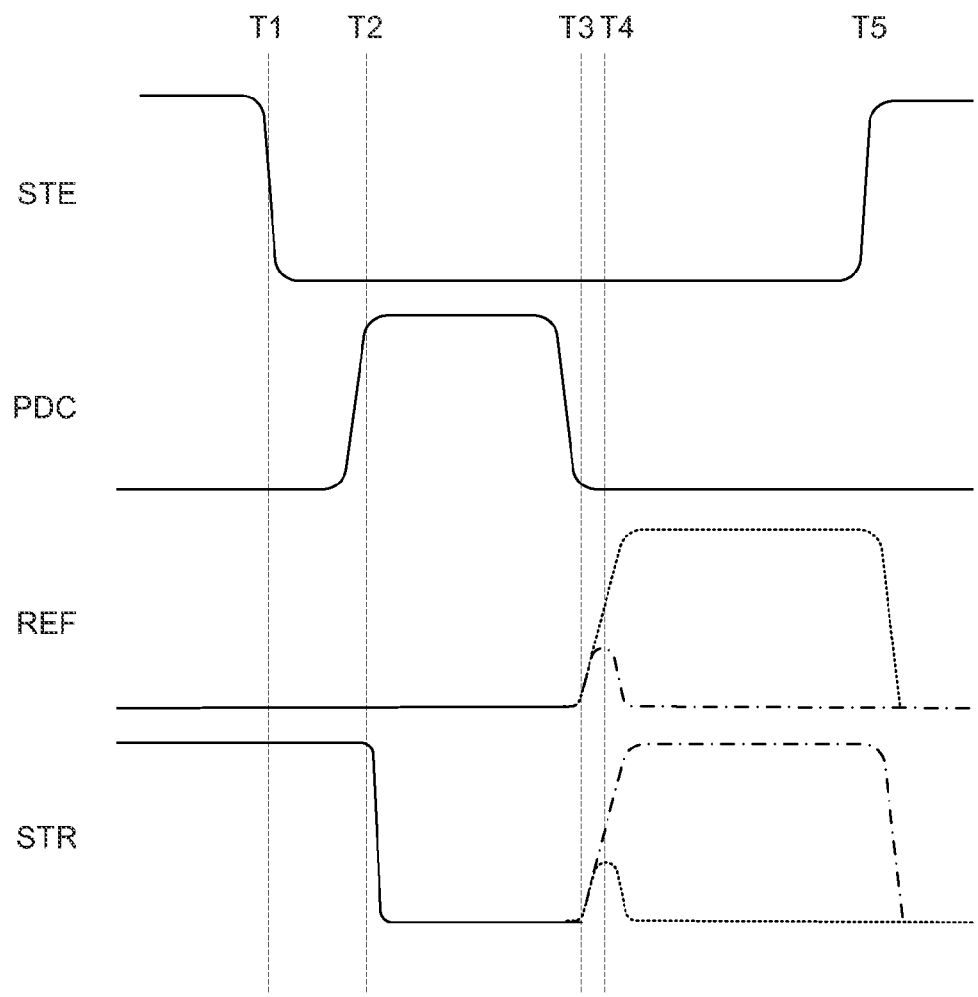
FIG. 5 is a timing diagram illustrating the operation of the circuit of FIG. 4.

The operation of the NBTI monitor 40 during a measurement operation is now described with reference to FIG. 4 and the timing diagram illustrated in FIG. 5. When the stress enable signal is asserted high during operation mode, the node 240R (REF) is grounded by the transmission gate 310R and the node 240S (STR) is held high by the transmission gate 310S. The keeper 230S is kept in a stressed state, while the keeper 230R is not. Thus, the keeper 230S experiences NBTI degradation in much the same manner as the keeper 140 in the dynamic circuit 20 illustrated in FIG. 2. When a measurement event is initiated, the STE signal is transitioned low at time T1, thereby opening the transmission gate switches 310 and closing the transmission gate switches 330.

After a first time interval, the PDCX signal is transitioned low. Because both STE and PDCX are low, PDC transitions high, as controlled by the NOR gate 290 and shown at time T2. Asserting PDC high enables the transistors 320, thereby grounding both nodes 240 and bringing REF and STR low. After a second time interval sufficient to allow the setting of the nodes 240, the PDCX signal is transitioned high at time T3, resulting in the PDC signal going low to start the measurement cycle.

The stressed circuit 200 operates to pull up the node 240S (STR), and the reference circuit operated to charge the node 240R (REF), thereby establishing a race condition. The nodes 240 charge at different rates based on the amount of NBTI degradation present in the keeper 230S and the level of compensating current provided by the compensation transistor 260S. If the compensation current is greater than the loss resulting from the NBTI effects, the node 240S will charge faster, while if the compensation current is less than the loss resulting from the NBTI effects, the node 240R will charge faster. The node that first reaches a voltage level sufficient to trigger the pull-down transistor 250 coupled to the other node essentially wins the timing race, as illustrated at time T4.

Once the pull-down transistor 250 is triggered, the losing node will go low and the winning node will continue to go high. The dashed lines in FIG. 5 represent the case where the compensation current is too low and the reference circuit 210 pulls the node 240R high first, and the dotted/dashed lines in FIG. 5 represent the case where the compensation current is too high and the stressed circuit 200 pulls the node 240S high first.

Data flip flops 350 are coupled to the nodes 240 to determine which node 240 goes high first. If the reference circuit 210 wins, the data flip flop 350R latches the result. In contrast, if the stressed circuit 200 wins, the data flip flop 350S latches the result. Returning to FIG. 1, the counter 50 is incremented by the data flip flop 250S and decremented by the data flip flop 250R. Increasing the value of the counter 50 increases the voltage of the PCOMP signal, thereby reducing the level of compensation current provided by the compensation transistor 80. Similarly, decreasing the value of the counter decreases the voltage of the PCOMP signal, thereby increasing the level of compensation current provided by the compensation transistor 80.

In this manner, the NBTI monitor 40 estimates the degree of NBTI degradation in the dynamic circuit 20 by subjecting the stressed circuit 200 to similar conditions experienced by the dynamic circuit 20. Comparing the response of the stressed circuit 200 to that of the reference circuit 210 provides a measure of actual degradation. Thus, the compensation current can be continuously updated as conditions change in the dynamic circuit 20 to provide a relatively constant level of performance over the lifetime of the dynamic circuit 20. Also, because the degradation monitored by the NBTI monitor 40 is applicable to all dynamic circuits 20 of the same type, the only circuitry needed to be provided for each instance of the dynamic circuit 20 is the compensation transistor 80 and the select transistor 90. As a result, the circuit density of the dynamic circuits 20 is not detrimentally affected.

The present illustrations have been directed to compensating for negative temperature bias instability, as this issue is present in current devices. However, for future technologies it is contemplated that positive bias temperature instability may become an issue. Thus, the degradation compensator 30 as described may be adapted to compensate for positive temperature bias instability by changing the P-type devices to N-type devices.

Figure 6:
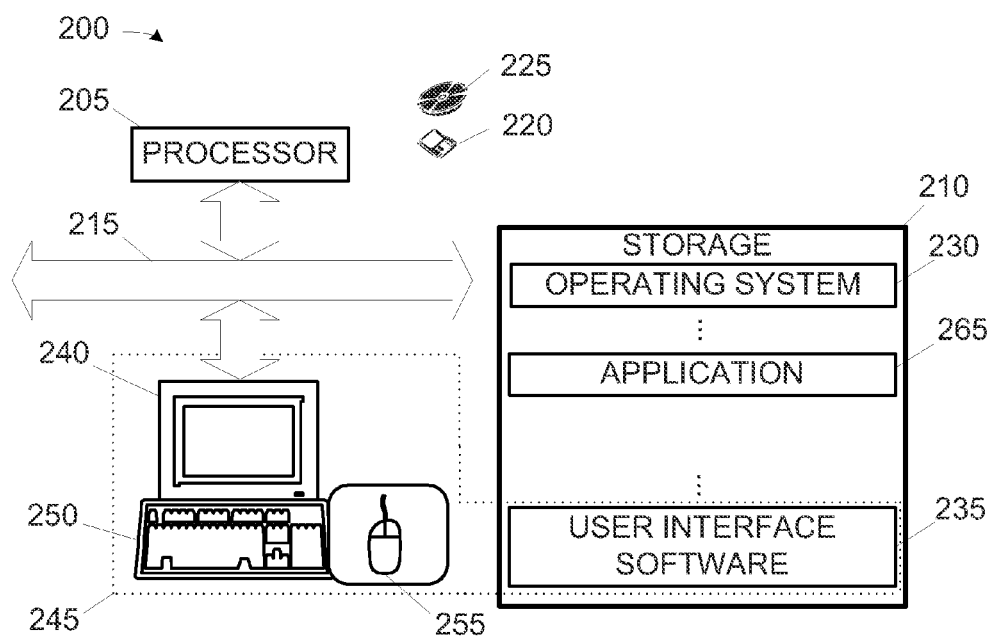
FIG. 6 is a simplified diagram of a computing apparatus that may be programmed to direct the fabrication of the integrated circuit device of FIG. 1.

FIG. 6 illustrates a simplified diagram of selected portions of the hardware and software architecture of a computing apparatus 400 such as may be employed in some aspects of the present subject matter. The computing apparatus 400 includes a processor 405 communicating with storage 410 over a bus system 415. The storage 410 may include a hard disk and/or random access memory ("RAM") and/or removable storage, such as a magnetic disk 420 or an optical disk 425. The storage 410 is also encoded with an operating system 430, user interface software 435, and an application 465. The user interface software 435, in conjunction with a display 440, implements a user interface 445. The user interface 445 may include peripheral I/O devices such as a keypad or keyboard 450, mouse 455, etc. The processor 405 runs under the control of the operating system 430, which may be practically any operating system known in the art. The application 465 is invoked by the operating system 430 upon power up, reset, user interaction, etc., depending on the implementation of the operating system 430. The application 465, when invoked, performs a method of the present subject matter. The user may invoke the application 465 in conventional fashion through the user interface 445. Note that although a stand-alone system is illustrated, there is no need for the data to reside on the same computing apparatus 400 as the application 465 by which it is processed. Some embodiments of the present subject matter may therefore be implemented on a distributed computing system with distributed storage and/or processing capabilities.

It is contemplated that, in some embodiments, different kinds of hardware descriptive languages (HDL) may be used in the process of designing and manufacturing very large scale integration circuits (VLSI circuits), such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., storage 410, disks 420, 425, solid state storage, and the like). In one embodiment, the GDSII data (or other similar data) may be adapted to configure a manufacturing facility (e.g., through the use of mask works) to create devices capable of embodying various aspects of the instant invention. In other words, in various embodiments, this GDSII data (or other similar data) may be programmed into the computing apparatus 400, and executed by the processor 405 using the application 465, which may then control, in whole or part, the operation of a semiconductor manufacturing facility (or fab) to create semiconductor products and devices. For example, in one embodiment, silicon wafers containing the dynamic circuits 20 and the degradation compensator 30 may be created using the GDSII data (or other similar data).

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. An integrated circuit device, comprising:
   a first circuit for providing current to a first node; and
   a degradation compensator including a first compensation circuit coupled to the first node to provide compensation current to the first node, wherein the degradation compensator is operable to estimate a degree of degradation in the first circuit and provide a compensation signal to the first compensation circuit to proportionally control the amount of compensation current based on the estimated degree of degradation.

2. The device of claim 1, wherein the degradation compensator comprises a degradation monitor including a stressed circuit corresponding to at least a portion of the first circuit and a reference circuit corresponding to the at least a portion of the first circuit, and the degradation monitor is operable to provide the compensation current to the stressed circuit, compare responses of the stressed and reference circuits, and adjust the compensation current based on the comparison.

3. The device of claim 2, wherein the degradation monitor is operable to enable the stressed circuit and disable the reference circuit during time periods that the first circuit is enabled.

4. The device of claim 2, wherein the degradation monitor comprises:
   a stressed node coupled to the stressed circuit;
   a reference node coupled to the reference circuit; and
   logic operable to enable the stressed and reference circuits and determine which of the stressed and reference nodes first exceeds a predetermined voltage in response to the stressed and reference circuits being enabled.

5. The device of claim 4, wherein the stressed circuit comprises a first transistor coupled to the reference node and operable to ground the reference node responsive to a voltage on the stressed node exceeding the predetermined voltage, and the reference circuit comprises a second transistor coupled to the stressed node and operable to ground the stressed node responsive to a voltage on the reference node exceeding the predetermined voltage.

6. The device of claim 4, wherein the degradation compensator further comprises:
   a counter coupled to the degradation monitor, wherein the logic is operable to adjust the counter depending on the particular one of the stressed and reference nodes that first exceeds the predetermined voltage;
   a bias generator coupled to the counter and operable to generate a bias signal corresponding to a value of the counter; and
   an amplifier operable to generate the compensation signal based on a value of the bias signal.

7. The device of claim 6, wherein the logic includes a first flip flop coupled to the stressed node and a second flip flop coupled to the reference node, and the counter is operable to increment responsive to receiving a first signal from one of the first and second flip flops and decrement responsive to receiving a second signal from the other of the first and second flip flops.

8. The device of claim 6, wherein the first compensation circuit comprises a P-type transistor, and the logic is operable to increment the counter to increase the bias signal responsive to the stressed node first exceeding the predetermined voltage and decrement the counter to decrease the bias signal responsive to the reference node first exceeding the predetermined voltage.

9. The device of claim 4, wherein the first compensation circuit comprises a first compensation transistor and a first select transistor coupled between the first compensation transistor and the first node, and the stressed circuit comprises a second compensation transistor and a second select transistor coupled between the second compensation transistor and the stressed node, and the logic is operable to enable the second select transistor during time periods that the first select transistor is enabled.

10. The device of claim 1, further comprising a second instance of the first circuit for providing current to a second node, wherein the degradation compensator includes a second compensation circuit coupled to the second node to provide compensation current to the second node, wherein the degradation compensator is further operable to provide the compensation signal to the second compensation circuit.

11. The device of claim 1, wherein the first circuit comprises a keeper circuit, and the first node comprises a bit line.

12. The device of claim 1, wherein the first circuit comprises a sleep enable circuit coupled between a primary voltage rail and a secondary voltage rail, and the first node comprises the secondary voltage rail.

13. An integrated circuit device, comprising:
a first circuit for providing current to a first node; and
a degradation compensator, comprising:
a first compensation transistor coupled to the first node;
a stressed circuit corresponding to at least a portion of the first circuit;
a reference circuit corresponding to the at least a portion of the first circuit; and
logic operable to compare responses of the stressed and reference circuits and, based on the comparison, generate a compensation signal for enabling the first compensation transistor to provide a compensation current to the first node that is proportional to a magnitude of the compensation signal.

14. The device of claim 13, wherein the logic is operable to enable the stressed circuit and disable the reference circuit during time periods that the first circuit is enabled.

15. The device of claim 13, wherein the degradation compensator comprises:
a stressed node coupled to the stressed circuit;
a reference node coupled to the reference circuit; and
wherein the logic is operable to enable the stressed and reference circuits and determine which of the stressed and reference nodes first exceeds a predetermined voltage in response to the stressed and reference circuits being enabled.

16. The device of claim 15, wherein the stressed circuit comprises a first transistor coupled to the reference node and operable to ground the reference node responsive to a voltage on the stressed node exceeding the predetermined voltage, and the reference circuit comprises a second transistor coupled to the stressed node and operable to ground the stressed node responsive to a voltage on the reference node exceeding the predetermined voltage.

17. The device of claim 15, wherein the degradation compensator further comprises:
a counter, wherein the logic is operable to adjust the counter depending on the particular one of the stressed and reference nodes that first exceeds the predetermined voltage;
a bias generator coupled to the counter and operable to generate a bias signal corresponding to a value of the counter; and
an amplifier operable to generate the compensation signal based on a value of the bias signal.

18. The device of claim 17, wherein the logic includes a first flip flop coupled to the stressed node and a second flip flop coupled to the reference node, and the counter is operable to increment responsive to receiving a first signal from one of the first and second flip flops and decrement responsive to receiving a second signal from the other of the first and second flip flops.

19. The device of claim 18, wherein the first compensation transistor comprises a P-type transistor, and the logic is operable to increment the counter to increase the bias signal responsive to the stressed node first exceeding the predetermined voltage and decrement the counter to decrease the bias signal responsive to the reference node first exceeding the predetermined voltage.

20. The device of claim 15, wherein the degradation compensator further comprises a first select transistor coupled between the first compensation transistor and the first node, and the stressed circuit comprises a second compensation transistor and a second select transistor coupled between the second compensation transistor and the stressed node, and the logic is operable to enable the second select transistor during time periods that the first select transistor is enabled.

21. The device of claim 13, further comprising a second instance of the first circuit for providing current to a second node, wherein the degradation compensator includes a second compensation transistor coupled to the second node to provide compensation current to the second node, wherein the degradation compensator is further operable to provide the compensation signal to the second compensation transistor.

22. The device of claim 13, wherein the first circuit comprises a keeper circuit, and the first node comprises a bit line.

23. The device of claim 13, wherein the first circuit comprises a sleep enable circuit coupled between a primary voltage rail and a secondary voltage rail, and the first node comprises the secondary voltage rail.

24. A method comprising:
providing current to a first node using a first circuit; and
providing compensation current to the first node using a first compensation circuit;
estimating a degree of degradation in the first circuit; and
providing a compensation signal to the first compensation circuit to proportionally control the amount of compensation current based on the estimated degree of degradation.

25. The method of claim 24, further comprising:
providing a stressed circuit corresponding to at least a portion of the first circuit and a reference circuit corresponding to the at least a portion of the first circuit;
providing the compensation current to the stressed circuit;
comparing responses of the stressed and reference circuits; and adjusting the compensation current based on the comparison.

26. The method of claim 25, further comprising enabling the stressed circuit and disabling the reference circuit during time periods that the first circuit is enabled.

27. The method of claim 25, wherein comparing the responses further comprises:
   providing a stressed node coupled to the stressed circuit;
   providing a reference node coupled to the reference circuit; and
   enabling the stressed and reference circuits; and
   determining which of the stressed and reference nodes first exceeds a predetermined voltage in response to the stressed and reference circuits being enabled.

28. The method of claim 27, further comprising:
   increasing the compensation current responsive to the reference node first exceeding the predetermined voltage; and
   decreasing the compensation current responsive to the stressed node first exceeding the predetermined voltage.

29. The method of claim 24, further comprising providing the compensation current to a second instance of the first circuit.

30. A computer readable storage device encoded with data that, when implemented in a manufacturing facility, adapts the manufacturing facility to create an apparatus, comprising:
   a first circuit for providing current to a first node; and
   a degradation compensator including a first compensation circuit coupled to the first node to provide compensation current to the first node, wherein the degradation compensator is operable to estimate a degree of degradation in the first circuit and provide a compensation signal to the first compensation circuit to proportionally control the amount of compensation current based on the estimated degree of degradation.

31. The computer readable storage device of claim 30, encoded with data that, when implemented in the manufacturing facility, adapts the manufacturing facility to create the apparatus, wherein the degradation compensator comprises a degradation monitor including a stressed circuit corresponding to at least a portion of the first circuit and a reference circuit corresponding to the at least a portion of the first circuit, and the degradation monitor is operable to provide the compensation current to the stressed circuit, compare responses of the stressed and reference circuits, and adjust the compensation current based on the comparison.

32. The computer readable storage device of claim 31, encoded with data that, when implemented in the manufacturing facility, adapts the manufacturing facility to create the apparatus, wherein the degradation monitor comprises:
   a stressed node coupled to the stressed circuit;
   a reference node coupled to the reference circuit; and
   logic operable to enable the stressed and reference circuits and determine which of the stressed and reference nodes first exceeds a predetermined voltage in response to the stressed and reference circuits being enabled.

33. The computer readable storage device of claim 32, encoded with data that, when implemented in the manufacturing facility, adapts the manufacturing facility to create the apparatus, wherein the degradation compensator further comprises:
   a counter coupled to the degradation monitor, wherein the logic is operable to adjust the counter depending on the particular one of the stressed and reference nodes that first exceeds the predetermined voltage;
   a bias generator coupled to the counter and operable to generate a bias signal corresponding to a value of the counter; and
   an amplifier operable to generate the compensation signal based on a value of the bias signal.

* * * * *